(12) United States Patent
Matsuo

(10) Patent No.: US 8,325,548 B2
(45) Date of Patent: Dec. 4, 2012

(54) SEMICONDUCTOR DEVICE AND SEMICONDUCTOR DEVICE TEST METHOD FOR IDENTIFYING A DEFECTIVE PORTION

(75) Inventor: Tatsuru Matsuo, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 109 days.

(21) Appl. No.: 12/819,357

(22) Filed: Jun. 21, 2010

(65) Prior Publication Data
US 2010/0322023 A1    Dec. 23, 2010

(30) Foreign Application Priority Data
Jun. 22, 2009  (JP) .................... 2009-147737

(51) Int. Cl.
G11C 7/00    (2006.01)
G11C 29/00   (2006.01)
(52) U.S. Cl. ........................ 365/201; 365/200
(58) Field of Classification Search .......... 714/719, 714/733; 365/200 X, 201 O, 200, 201
See application file for complete search history.

(56) References Cited

U.S. PATENT DOCUMENTS
6,504,772 B2 * 1/2003 Maeno ............ 365/201
7,134,063 B2 * 11/2006 Cho et al. ........ 714/733

FOREIGN PATENT DOCUMENTS
| JP | 11-250687 A    | 9/1999 |
| JP | 2001-267389 A  | 9/2001 |
| JP | 2003-036696 A  | 2/2003 |
| JP | 2007-066380 A  | 3/2007 |

* cited by examiner

Primary Examiner — VanThu Nguyen
(74) Attorney, Agent, or Firm — Fujitsu Patent Center

(57) ABSTRACT

A semiconductor device includes a first memory including a first memory cell and a first redundant memory cell; a first test circuit configured to test the first memory and output first defect information indicating a defective portion included in the first memory cell; a first storage part; and a first control circuit configured to, based on unmodified information stored in the first storage part, and the first defect information, determine modified information to be stored in the first storage part, wherein the first memory identifies the defective portion based on the modified information of the first storage part and replaces the first memory cell including the defective portion with the first redundant memory cell.

12 Claims, 13 Drawing Sheets

FIG. 8A

| INPUT | | | OUTPUT | | | | |
|---|---|---|---|---|---|---|---|
| pf2 | pf1 | NUMBER OF "1"S INCLUDED IN fb[b-1:0] | r | nf2 | nf1 | fb2[b-1:0] | fb1[b-1:0] |
| 0 | 0 | 0 | 0 | 0 | 0 | All 0 | All 0 |
| 0 | 0 | 1 | 0 | 0 | 1 | All 0 | *1 |
| 0 | 0 | 2 | 0 | 1 | 1 | *2 | *1 |
| 0 | 0 | 3 OR MORE | 1 | 1 | 1 | *2 | *1 |
| 0 | 1 | 0 | 0 | 0 | 1 | All 0 | All 1 |
| 0 | 1 | 1 | 0 | 1 | 1 | *1 | All 1 |
| 0 | 1 | 2 OR MORE | 1 | 1 | 1 | *1 | All 1 |
| 1 | 1 | 0 | 0 | 1 | 1 | All 1 | All 1 |
| 1 | 1 | 1 OR MORE | 1 | 1 | 1 | All 1 | All 1 |

FIG. 8B

| fb[5:0] | *1 | *2 |
|---|---|---|
| 000010 | 111110 | - |
| 001000 | 111000 | - |
| 001010 | 111110 | 111000 |
| 001110 | 111110 | 111100 |
| 110001 | 111111 | 110000 |

FIG. 9

| DEFECTIVE LOCATION | CUTOFF CONTENTS [2:0] |
|---|---|
| 0TH BIT | 001 |
| 1ST BIT | 010 |
| 2ND BIT | 011 |
| 3RD BIT | 100 |
| 4TH BIT | 101 |
| 5TH BIT | 110 |
| NOT DEFECTIVE | 000 |

FIG. 10

| INPUT [5:0] | OUTPUT [2:0] |
|---|---|
| xxxxx1 | 001 |
| xxxx10 | 010 |
| xxx100 | 011 |
| xx1000 | 100 |
| x10000 | 101 |
| 100000 | 110 |
| 000000 | 000 |

SEMICONDUCTOR DEVICE AND SEMICONDUCTOR DEVICE TEST METHOD FOR IDENTIFYING A DEFECTIVE PORTION

CROSS-REFERENCE TO RELATED APPLICATION

This application is based upon and claims the benefit of priority of the prior Japanese Patent Application No. 2009-147737, filed on Jun. 22, 2009, the entire contents of which are incorporated herein by reference.

FIELD

The embodiment discussed herein relates to a semiconductor device and a semiconductor device test method.

BACKGROUND

A semiconductor memory may have redundancy when replacing a defective memory cell with a redundant memory cell. When a defective memory cell is discovered due to an operational test performed on memory cells before shipping the semiconductor memory, the location information of the defective memory cell is stored in, for example, a fuse circuit. Based on the location information of the defective memory cell, a redundant memory cell is accessed in a read operation instead of the defective memory cell. The defective memory cell may be replaced with the redundant memory cell in units of data bits, word lines, or column lines.

The fuse circuit may include a latch circuit that corresponds to one fuse and latches data for indicating a state of the fuse, that is, whether or not the fuse is cut off. For example, when the defective memory cell is repaired in units of data bits, a redundant memory block is prepared and a memory block including a defective data bit is replaced with the redundant memory block. The location of the defective data bit is stored in the fuse circuit to replace the memory block including the defective data bit with the redundant memory block.

When the number of data bits is 32 for example, six fuse circuits may be provided. The locations of the 32 data bits may be designated with five fuse circuits. However, since it is desirable to further designate use or nonuse of the redundancy, a total of six fuse circuits may be needed. Each group of the six fuse circuits is referred to as a fuse group. Based on a code indicating the location of a defective data bit, at least one of the fuses in the fuse group is cut off. Information regarding the fuse that has been cut off is supplied to a redundant switch circuit through a corresponding latch circuit. Based on the information regarding the fuse that has been cut off, the redundant switch circuit replaces a memory block corresponding to the location of the defective data bit with a redundant memory block.

When a semiconductor chip is handled, such as a system on chip (SoC), a memory built-in self test (MBIST) circuit is provided around each memory. The MBIST circuit is used, for example, to generate a test pattern and determine a memory test result. A self repair operation called "built-in self repair (BISR)" for automatically replacing a defective portion with a redundant memory cell may be performed in the chip when the defective portion is found in the memory by a self check operation, such as a built-in self test (BIST). The defective portion may be repaired with the BISR without outputting the memory test result (information regarding the memory cell corresponding to the defective portion) to a large scale integration (LSI) tester outside the chip. Accordingly, the memory may be repaired efficiently at a high speed.

Preferably, two or more redundant memory cells and fuse groups are prepared to repair two or more defective portions individually so that the yield rate of the memory may increase. When the redundant operation is performed in units of data bits for example, up to two defective data bits may be repaired with two redundant memory blocks and two fuse groups. When two or more fuse groups are used in a configuration for the BISR as described above, the allocation of the fuse groups to one or more found defective portions is determined.

Since some memory cells are found defective in a test performed under certain voltage and temperature conditions, the memory test is desirably performed two or more times under different voltage and temperature conditions. When the memory test is performed two or more times, a defective portion is repaired each time one test operation is finished. That is, another fuse group is allocated as a target to be cut off instead of a fuse group that has already been cut off in a previous test, each time a defective portion is discovered in a new memory test operation.

SUMMARY

According to an aspect of an embodiment, a semiconductor device includes a first memory including a first memory cell and a first redundant memory cell; a first test circuit configured to test the first memory and output first defect information indicating a defective portion included in the first memory cell; a first storage part; and a first control circuit configured to, based on unmodified information stored in the first storage part, and the first defect information, determine modified information to be stored in the first storage part, wherein the first memory identifies the defective portion based on the modified information of the first storage part and replaces the first memory cell including the defective portion with the first redundant memory cell.

According to another aspect of an embodiment, a semiconductor device test method includes testing a memory that is included in a semiconductor device and includes a memory cell and a redundant memory cell, and generating defect information indicating a defective portion included in the memory cell; determining modified information to be stored in the storage part based on unmodified information stored in a storage part included in the semiconductor device and based on the defect information by performing a logic operation in the semiconductor device; and writing the modified information in the storage part to replace the memory cell including the defective portion identified based on the modified information of the storage part with the redundant memory cell.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8A illustrates relationships between input logical values and output logical values of the separation and determination circuit in FIG. 7;

FIG. 8B illustrates examples of bit patterns of the separation and determination circuit in FIG. 7;

FIG. 9 illustrates relationships between defective bit locations and fuse cutoff patterns;

FIG. 10 illustrates relationships between inputs and outputs of an encoder in FIG. 6;

DESCRIPTION OF EMBODIMENT

Figure 1:
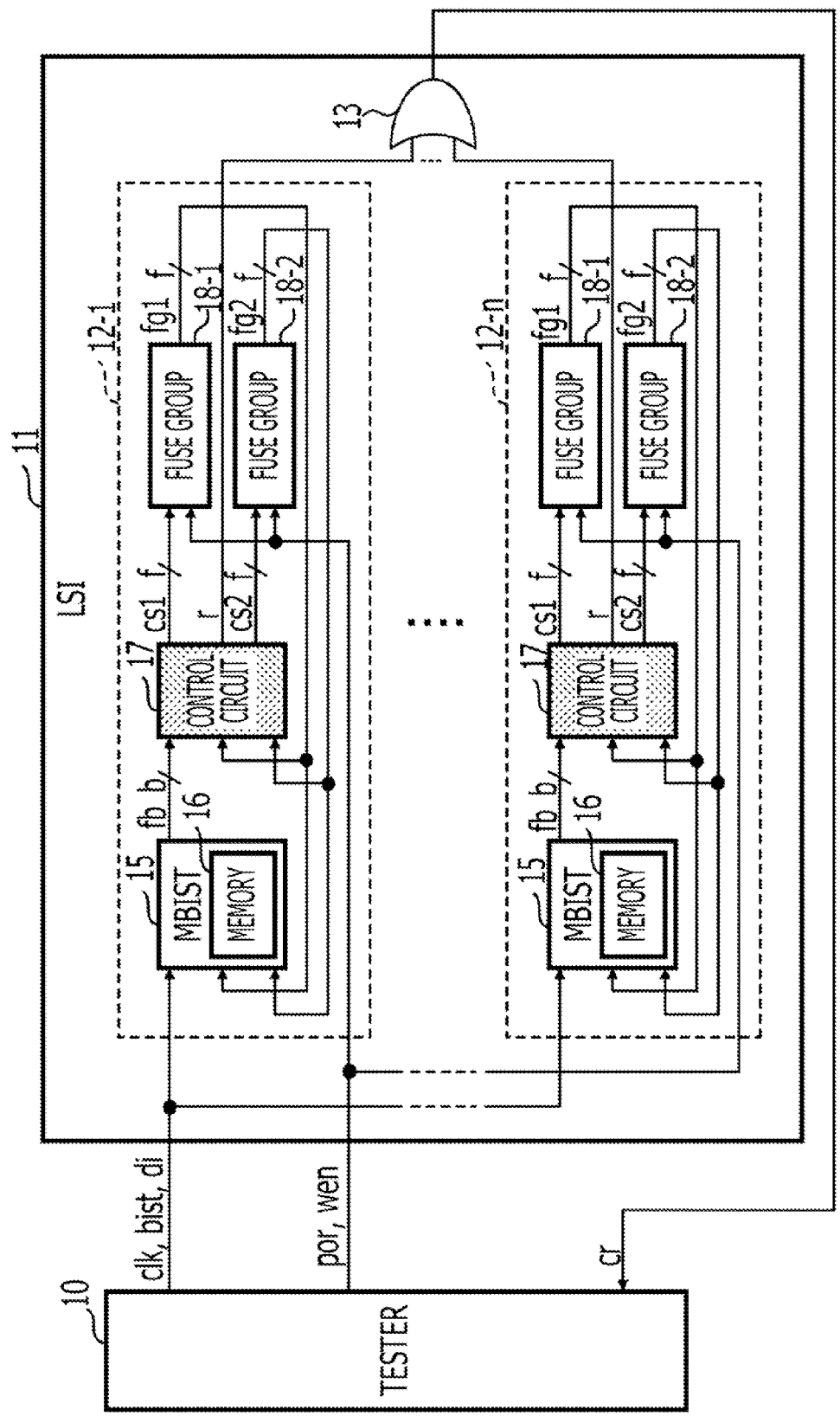
FIG. 1 illustrates a semiconductor device test system.

FIG. 1 illustrates a semiconductor device test system. The system in FIG. 1 includes a tester 10 and a semiconductor device 11. The semiconductor device 11, for example, may be a system on chip (SoC). The tester 10 is coupled to each signal terminal of the semiconductor device 11. The tester 10 controls an operation of the semiconductor device 11 and performs various tests on the semiconductor device 11 by supplying various signals to the semiconductor device 11. The tester 10 determines whether or not the semiconductor device 11 is defective by controlling a test operation and determining a result of the test operation based on various signals output from the semiconductor device 11.

The semiconductor device 11 includes memory units 12-1 to 12-n, and an OR circuit 13. Each of the memory units 12-1 to 12-n in FIG. 1 includes a memory built-in self test (MBIST) circuit 15, a memory 16, a control circuit 17, and fuse groups 18-1 and 18-2. Although the memory units 12-1 to 12-n in FIG. 1 have substantially the same configurations, the memory units 12-1 to 12-n may have different configurations. For example, the numbers of fuse groups in the memory units 12-1 to 12-n may be different from each other and may be set individually.

The memory 16 includes memory cells and redundant memory cells. The MBIST circuit 15 tests the memory 16 and outputs defect information fb indicating defective portions included in the memory cells. For example, the tester 10 supplies a clock signal clk, a built-in self test (BIST) start signal bist, and initial data di in the test. In response to the BIST start signal bist, the MBIST circuit 15 starts a test operation synchronized with the clock signal clk. The MBIST circuit 15 generates various addresses and data based on the initial data di, applies the generated addresses and data to the memory 16, and tests the memory 16. The control circuit 17 determines modified information cs1 to be stored in the fuse group 18-1 based on unmodified information fg1 stored in the fuse group 18-1 and the defect information fb. Further, the control circuit 17 determines modified information cs2 to be stored in the fuse group 18-2 based on unmodified information fg2 stored in the fuse group 18-2. When the tester 10 applies a fuse cutoff instruction signal wen to the fuse groups 18-1 and 18-2, the fuse cutoff operation is performed based on the stored information cs1 and cs2. That is, the stored information cs1 and cs2 are stored in the fuse groups 18-1 and 18-2, respectively. The memory 16 identifies defective portions based on the information fg1 and fg2 stored in the fuse groups 18-1 and 18-2, which correspond to the information cs1 and cs2, respectively, and replaces the memory cells including the identified defective portions with the redundant memory cells.

Figure 2:
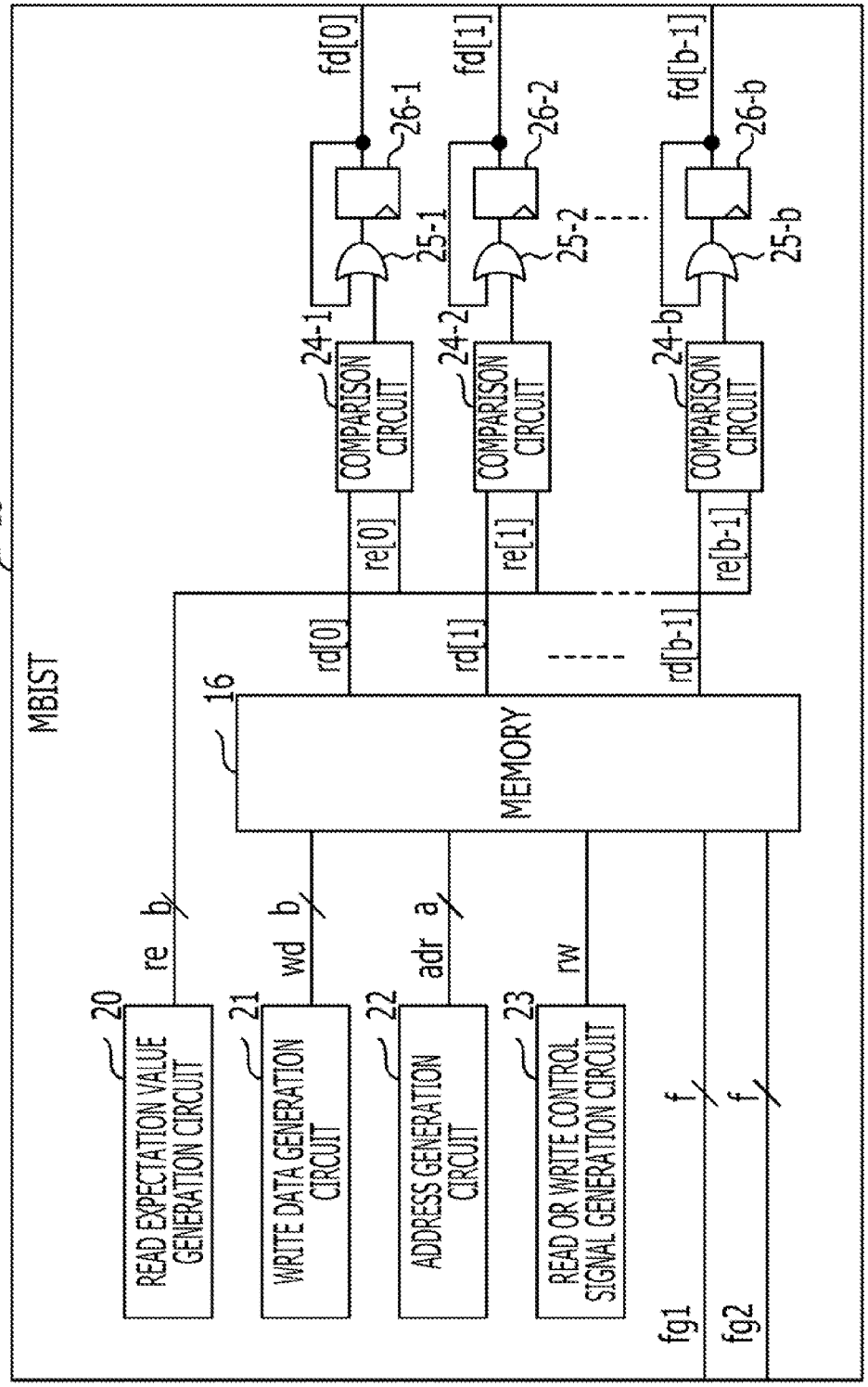
FIG. 2 illustrates a memory built-in self test (MBIST) circuit.

FIG. 2 illustrates the MBIST circuit 15. The MBIST circuit 15 includes a read expectation value generation circuit 20, a write data generation circuit 21, an address generation circuit 22, a read or write control signal generation circuit 23, comparison circuits 24-1 to 24-b, OR circuits 25-1 to 25-b, and flip flops 26-1 to 26-b. In FIG. 2, b represents the number of bits of the data read from the memory 16.

As described above with reference to FIG. 1, the MBIST circuit 15 starts the test operation synchronized with the clock signal clk in response to the BIST start signal bist, generates various addresses and data based on the initial data di, and applies the generated addresses and data to the memory 16 to test the memory 16. In the test operation, for example, the address generation circuit 22 generates an address adr. The address adr may designate an access location in the memory 16. The read or write control signal generation circuit 23 generates a read or write control signal rw. The read or write control signal rw may indicate a read operation or a write operation. The read or write control signal rw may be two or more signals, such as write enable signals or chip enable signals. The write data generation circuit 21 generates write data wd with various patterns including a march pattern, a checkerboard pattern, a stripe pattern, a data mask function test pattern, or a gallop pattern. When the read or write control signal rw indicates the write operation, the generated write data wd is written in a storage location in the memory 16, which is designated by the address adr.

When the read or write control signal rw indicates the read operation, data rd[0] to rd[b-1] are read from the storage location in the memory 16, which is designated by the address adr, and are supplied to the comparison circuits 24-1 to 24-b, respectively. The read expectation value generation circuit 20 generates expectation value data re[0] to re[b-1] corresponding to the performed test operation, and supplies the generated expectation value data re[0] to re[b-1] to the comparison circuits 24-1 to 24-b. The comparison circuits 24-1 to 24-b determine whether or not the memory 16 operates as desired by comparing the data read from the memory 16 with the expectation value data supplied from the read expectation value generation circuit 20 on a bit basis. For example, b-bit determination results output from the comparison circuits 24-1 to 24-b may be "0" in bit locations where the read data match the expectation value data, and may be "1" in bit locations where the read data fail to match the expectation value data. The b-bit determination results output from the comparison circuits 24-1 to 24-b are stored in the flip flops 26-1 to 26-b through the OR circuits 25-1 to 25-b. Each of the OR circuits 25-1 to 25-b performs an OR operation on the b-bit determination result regarding each bit of the previously read data, and the determination result regarding each bit of the currently read data. The determination results are accumulated by the OR operations. A bit determined as defective at least once (a bit with the value "1") as a result of performing the determination two or more times on the read data maintains the value "1", which indicates that the bit is defective. The MBIST circuit 15 outputs the values stored in the flip flops 26-1 to 26-b as defective bit data fb[0] to fb[b-1], that is, the defect information fb in FIG. 1.

Figure 3:
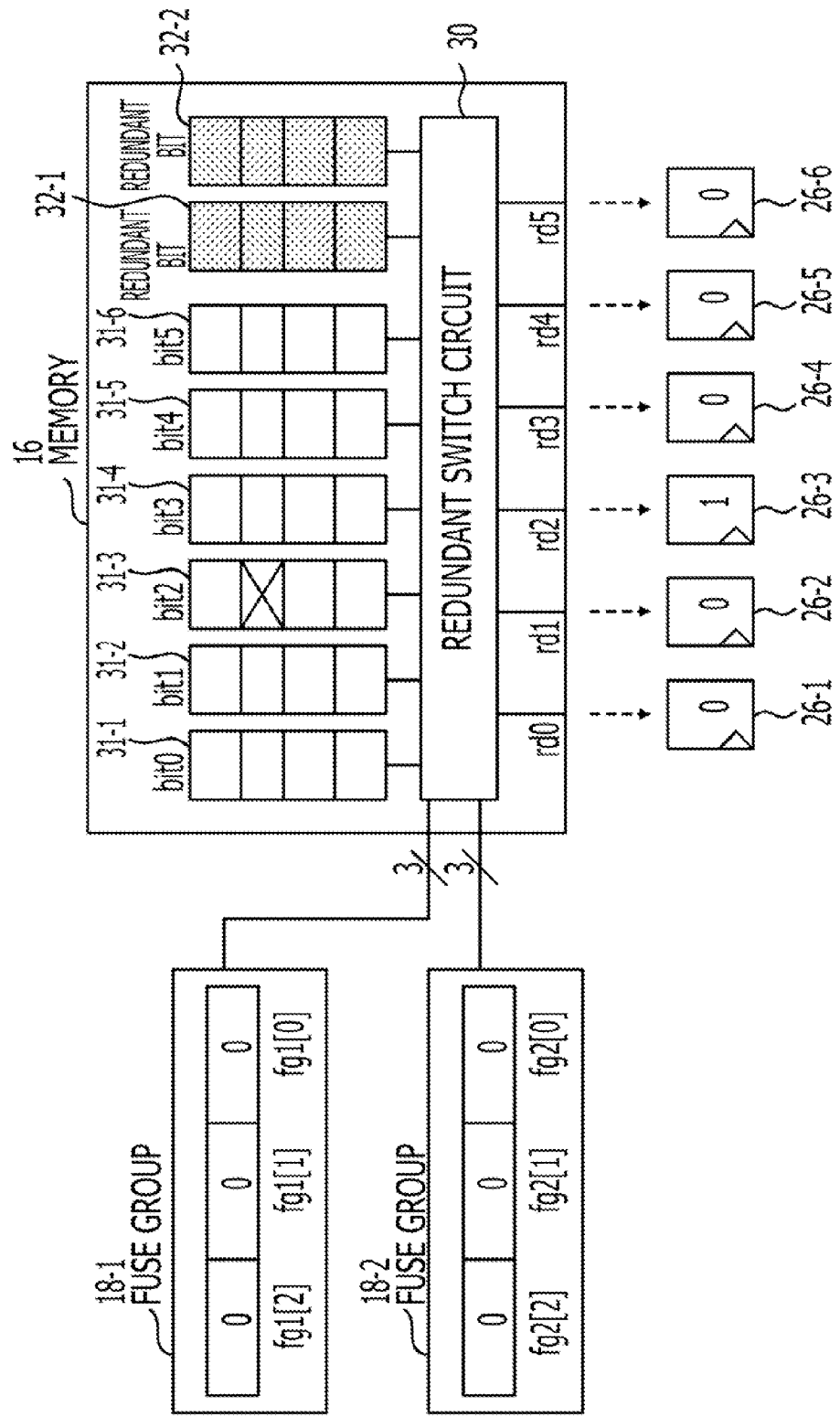
FIG. 3 illustrates a redundant operation of a memory.

FIG. 3 illustrates a redundant operation of the memory 16. The memory 16 includes six memory blocks 31-1 to 31-6, two redundant memory blocks 32-1 and 32-2, and a redundant switch circuit 30. The redundant switch circuit 30 identifies defective portions based on the information fg1 stored in the fuse group 18-1, and the information fg2 stored in the fuse group 18-2, and replaces the memory cells including the identified defective portions with the redundant memory cells. The fuse group 18-1 stores the 3-bit information fg1

(fg1[0] to fg1[2]). The fuse group 18-2 stores the 3-bit information fg2 (fg2[2] to fg2[2]). Based on the 3-bit information fg1 or fg2, one of the six memory blocks is identified as defective. That is, the two fuse groups 18-1 and 18-2 may identify two defective memory blocks of the memory blocks 31-1 to 31-6.

Each of the fuse groups 18-1 and 18-2 stores "000" as initial information stored in an initial state. In the initial state, the redundant switch circuit 30 outputs 6-bit data (bits rd0 to rd5) read from the memory blocks 31-1 to 31-6 to outside of the memory 16 without changing the read data. The data read from the memory 16 undergoes the determination by the MBIST circuit 15 and the determination result is stored in the flip flops 26-1 to 26-6 of the MBIST circuit 15. In FIG. 3, the memory block 31-3 includes a defective portion and the third bit of the determination result stored in the flip flop 26-3 indicates the value "1". When two memory blocks include defective portions, two bits of the determination result stored in the two corresponding flip flops of the flip flops 26-1 to 26-6 indicate the value "1". The values stored in the flip flops 26-1 to 26-6 are supplied to the control circuit 17 in FIG. 1 as the defect information fb.

Based on the unmodified information fg1 stored in the fuse group 18-1 and the unmodified information fg2 stored in the fuse group 18-2, the control circuit 17 in FIG. 1 determines the modified information cs1 to be stored in the fuse group 18-1 and the modified information cs2 to be stored in the fuse group 18-2, respectively. The fuse cutoff operation is performed based on the modified information cs1 and cs2 when the tester 10 applies the fuse cutoff instruction signal wen to the fuse groups 18-1 and 18-2. The memory 16 identifies two or more defective portions based on the modified information fg1 of the fuse group 18-1 and the modified information fg2 of the fuse group 18-2, and replaces the memory cells including the identified defective portions with the redundant memory cells.

Figure 4:
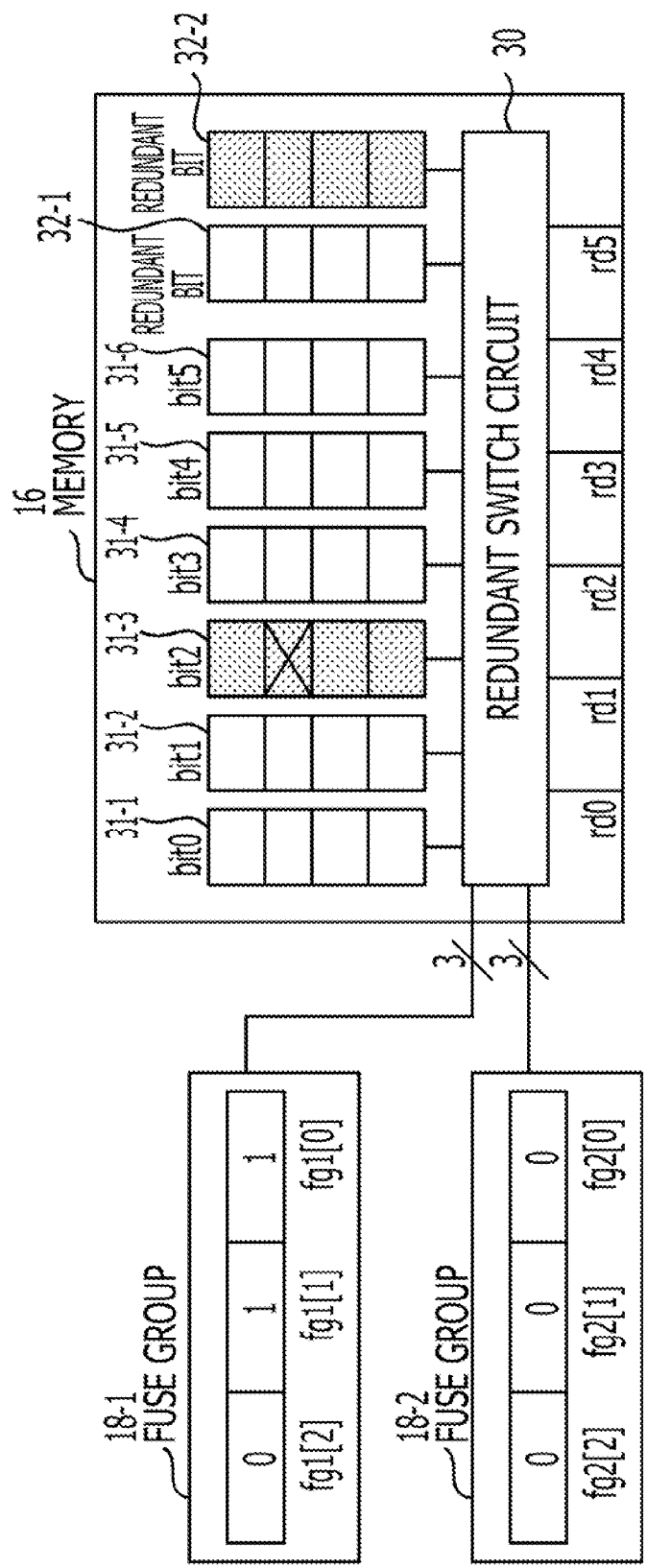
FIG. 4 is an illustration for explaining the redundant operation of the memory in FIG. 3.

FIG. 4 is an illustration for explaining the redundant operation of the memory 16. In FIG. 4, the fuse group 18-1 stores "011" as information indicating the location of the defective memory block 31-3 of the memory 16. That is, the information stored in the fuse group 18-1 is modified. The information stored in the fuse group 18-2 maintains the initial value "000" and remains unmodified. The redundant switch circuit 30 identifies the memory block 31-3 as defective based on the information fg1[0] to fg1[2] stored in the fuse group 18-1, and replaces the defective memory block 31-3 with the redundant memory block 32-1. That is, data bit2 is desired to be read or written, the read or write operation is performed on the redundant memory block 32-1 instead of the defective memory block 31-3. In the write operation, data bit0, data bit1, and data bit3 to bit5 are written in the memory blocks 31-1, 31-2, and 31-4 to 31-6, respectively, and the data bit2 is written in the redundant memory block 32-1. In the read operation, the data read from the memory blocks 31-1, 31-2, and 31-4 to 31-6 are output as the bits rd0, rd1, and rd3 to rd5, respectively, and the data read from the redundant memory block 32-1 is output as the bit rd2. As described above, the redundant switch circuit 30 performs the operation using the redundant bits. The redundant operation may be performed on the bits by replacing each defective portion as described above, and/or by a shift redundant operation in which bits are divided into groups and each of the groups is shifted one time.

Figure 5:
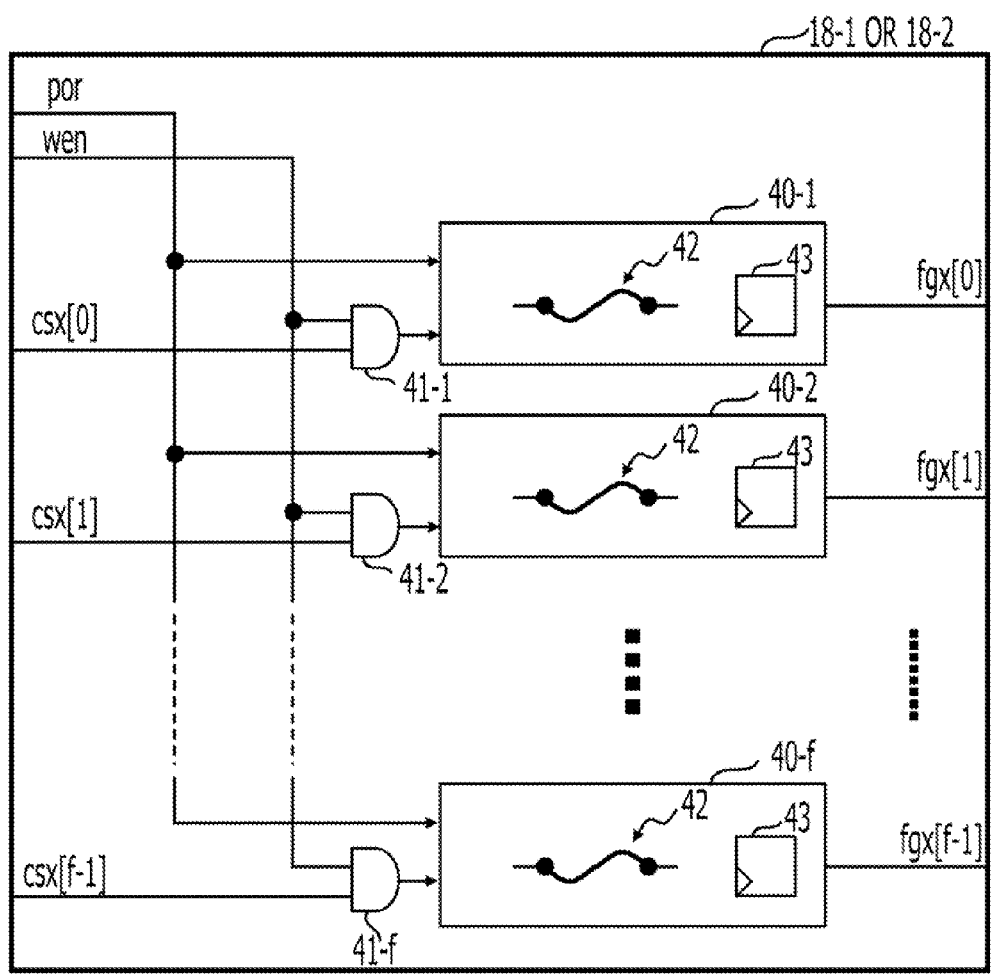
FIG. 5 illustrates a fuse group.

FIG. 5 illustrates the fuse group 18-1 or 18-2. The fuse group 18-x (x=1 or 2) includes f fuse circuits 40-1 to 40-f and f AND circuits 41-1 to 41-f. As used herein, f represents a number being two or more. The configurations of the fuse circuits 40-1 to 40-f may be substantially the same. Each of the fuse circuits 40-1 to 40-f includes a fuse 42 that may be electrically cut off and a latch circuit 43. Signals csx[0] to csx[f-1] (x=1 or 2) are information to be stored for the modification and are supplied from the control circuit 17 in FIG. 1. Each of the signals csx[0] to csx[f-1] indicates "1" in a bit location where the fuse 42 is cut off, or indicates "0" in a bit location where the fuse 42 is not cut off. When the tester 10 applies the fuse cutoff instruction signal wen, that is, when the signal wen is asserted to indicate "1", the value of an output from at least one of the AND circuits 41-1 to 41-f that corresponds to a bit indicating "1" and included in at least one of the signals csx[0] to csx[f-1] becomes "1". At least one of the fuses 42 included in the fuse circuits 40-1 to 40-f to which the output with the value "1" from the corresponding one of the AND circuits 41-1 to 41-f is applied is electrically cut off. That is, a large amount of current is applied to the fuse 42 and the resistance of the fuse 42 increases due to electromigration.

When the tester 10 asserts a fuse group output initialization signal por, the latch circuit 43 stores a value corresponding to the cutoff or non-cutoff of the fuse 42 of a corresponding one of the fuse circuits 40-1 to 40-f. For example, when the fuse 42 is cut off, the corresponding latch circuit 43 stores the value "1". For example, when the fuse 42 is not cut off, the corresponding latch circuit 43 stores the value "0". The value stored in each of the latch circuits 43 of the fuse circuits 40-1 to 40-f is output as information fgx[0] to fgx[f-1] (x=1 or 2) stored in the fuse group 18-x.

Figure 6:
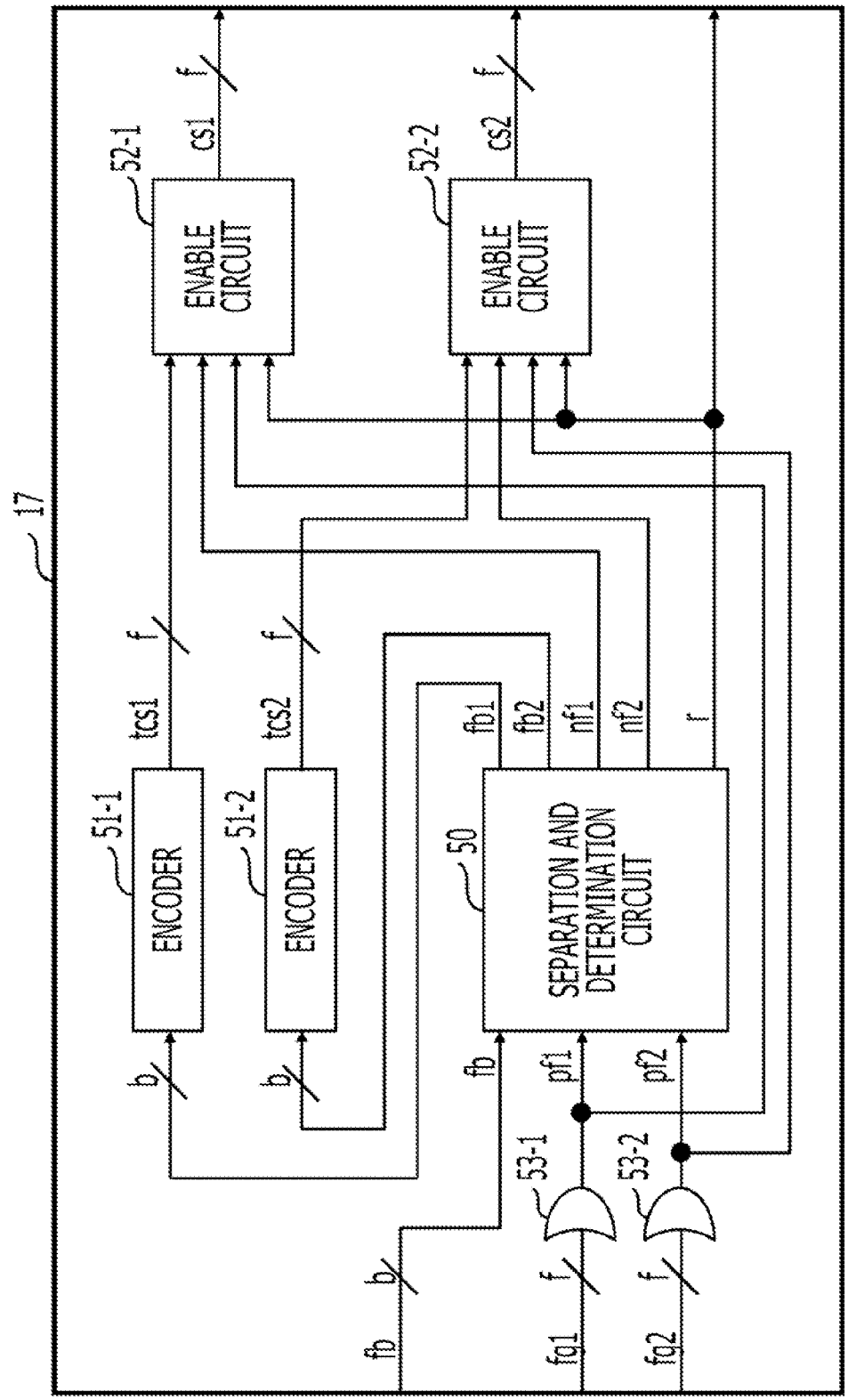
FIG. 6 illustrates a control circuit.

FIG. 6 illustrates the control circuit 17. The control circuit 17 includes a separation and determination circuit 50, encoders 51-1 and 51-2, enable circuits 52-1 and 52-2, and OR circuits 53-1 and 53-2. For example, the control circuit 17 may be a combinational logic circuit that does not include a memory element, such as a flip flop. That is, the control circuit 17 may be designed as a combinational logic circuit that is not a sequential logic circuit.

When two or more defective portions are found, the b-bit defect information fb output from the MBIST circuit 15 is data in which all of the bits corresponding to the defective portions have the value "1", and is information that indicates the defective portions all together. Based on the defect information fb, the separation and determination circuit 50 of the control circuit 17 generates information fb1 and fb2 indicating each of the defective portions. For example, when the number of bits of the output from the memory 16 is six, the information fb1 indicates the location of one defective bit included in the six bits, and the information fb2 indicates the location of another defective bit included in the six bits.

Based on the stored information fg1 and fg2, and the defect information fb, the separation and determination circuit 50 of the control circuit 17 outputs a determination signal r indicating whether or not the memory 16 may be repaired. The separation and determination circuit 50 and the encoders 51-1 and 51-2 generate modified stored information by, for example, converting the 6-bit defect information fb into codes tcs1 and tcs2, each of which has the bits fewer than the bits of the defect information fb.

Figure 7:
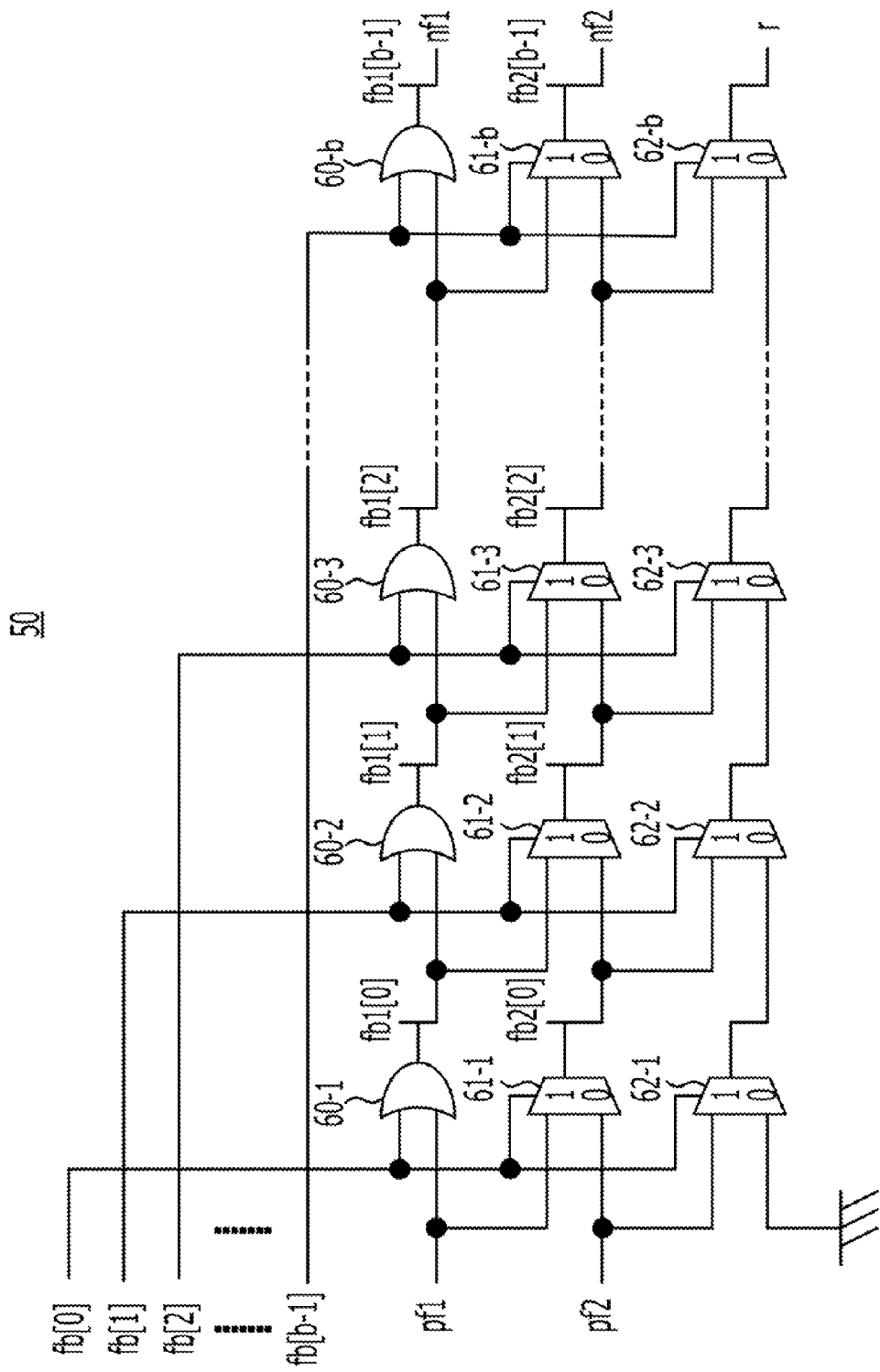
FIG. 7 illustrates a separation and determination circuit.

FIG. 7 illustrates the separation and determination circuit 50. The separation and determination circuit 50 includes b OR circuits 60-1 to 60-b, b selectors 61-1 to 61-b, and b selectors 62-1 to 62-b when b represents the number larger than or equal to two. An input terminal of each of the OR circuits 60-1 to 60-b receives corresponding one of the defective bit data fb[0] to fb[b-1], which are obtained based on the defect information fb, from the MBIST circuit 15. The other input terminal of the OR circuit 60-x (x is any one of the values from two to b), which is one of the OR circuits 60-1 to 60-b and is provided in the second stage or a stage after the second stage, receives an output from the OR circuit 60-*x*-1 provided in the preceding stage. The other input terminal of the OR circuit 60-1 receives an OR value pf1 obtained by performing an OR operation on all of the bits of the information fg1 output from the fuse group 18-1 using the OR circuit 53-1 in FIG. 6.

A first input terminal of the selector 61-*x* (x is any one of the values from two to b), which is one of the selectors 61-1 to 61-*b* and is provided in the second stage or a stage after the second stage, receives an output from the selector 61-*x*-1 provided in the preceding stage. A first input terminal of the selector 61-1 receives the OR value pf1 from the OR circuit 53-1 in FIG. 6. A second input terminal of the selector 61-*x* receives the output from the selector 61-*x*-1 provided in the preceding stage. A second input terminal of the selector 61-1 receives an OR value pf2 obtained by performing an OR operation on all of the bits of the information fg2 output from the fuse group 18-2 using the OR circuit 53-2 in FIG. 6. The selectors 61-1 to 61-*b* receive the defective bit data fb[0] to fb[b-1] included in the defect information fb from the MBIST circuit 15 as selection control signals. When the selection control signal indicates "1", the first input terminal is selected. When the selection control signal indicates "0", the second input terminal is selected.

A first input terminal of the selector 62-*x* (x is any one of the values from two to b), which is one of the selectors 62-1 to 62-*b* and is provided in the second stage or a stage after the second stage, receives an output from the selector 61-*x*-1 provided in the preceding stage. A first input terminal of the selector 62-1 receives the OR value pf2 from the OR circuit 53-2 in FIG. 6. A second input terminal of the selector 62-*x* receives an output from the selector 62-*x*-1 provided in the preceding stage. A second input terminal of the selector 62-1 receives "0" as a fixed value. The selectors 62-1 to 62-*b* receive the defective bit data fb[0] to fb[b-1] included in the defect information fb from the MBIST circuit 15 as selection control signals. When the selection control signal indicates "1", the first input terminal is selected. When the selection control signal indicates "0", the second input terminal is selected.

The OR circuits 60-1 to 60-*b* output bits fb1[0] to fb1[*b*-1] as the information fb1, respectively. The information fb1 is supplied to the encoder 51-1 in FIG. 6. The final bit fb1[*b*-1] is supplied to the enable circuit 52-1 in FIG. 6 as a signal nf1. The selectors 61-1 to 61-*b* output bits fb2[0] to fb2[*b*-1] as the information fb2. The information fb2 is supplied to the encoder 51-2 in FIG. 6. The final bit fb2[*b*-1] is supplied to the enable circuit 52-2 in FIG. 6 as a signal nf2.

The separation and determination circuit 50 in FIG. 7 determines the value of corresponding one of the defective bit data fb[0] to fb[b-1], which are obtained based on the defect information fb, in the order from the bit location of "0" to the bit location of "b-1". The bit location in which when the determination is performed in the order from the bit location of "0" to the bit location of "b-1", the value "1" is obtained for the first time is reflected in the bits fb1[0] to fb1[*b*-1]. When the OR value pf1 is "0", a first bit pattern is obtained for the bit line of the bits fb1[0] to fb1[*b*-1]. In the first bit pattern for the bit line of the bits fb1[0] to fb1[*b*-1], the value "0" is indicated in the bit location(s) before the bit location in which the value "1" is obtained for the first time, and the value "1" is indicated in the bit location(s) in and after the bit location in which the value "1" is obtained first. Further, the separation and determination circuit 50 in FIG. 7 determines the value of each bit in the order from the bit location of "0" to the bit location of "b-1", and causes the location in which the value "1" is obtained for the second time to be reflected in the bits fb2[0] to fb2[*b*-1]. When the OR value pf2 is "0", a second bit pattern is obtained for the bit line of the bits fb1[0] to fb1[*b*-1]. In the second bit pattern for the bit line of the bits fb1[0] to fb1[*b*-1], the value "0" is indicated in the bit location(s) before the bit location in which the value "1" is obtained for the second time, and the value "1" is indicated in the bit location(s) in and after the bit location in which the value "1" is obtained for the second time.

FIG. 8A illustrates relationships between input logical values and output logical values of the separation and determination circuit 50 in FIG. 7. The OR values pf1 and pf2 are hereinafter referred to also as "inputs pf1 and pf2", respectively. The determination signal r is hereinafter referred to also as "output r". The signals nf1 and nf2 are hereinafter referred to also as "outputs nf1 and nf2", respectively. As illustrated in FIG. 8A, the output nf1 indicates the value "1" when the number of "1"s included in the inputs pf1 and pf2, and the defective bit data fb[0] to fb[b-1] is one or more. Alternatively, the output nf1 indicates the value "0" when the number of "1"s included in the inputs pf1 and pf2, and the defective bit data fb[0] to fb[b-1] is zero. The output nf2 indicates the value "1" when the number of "1"s included in the inputs pf1 and pf2, and the defective bit data fb[0] to fb[b-1] is two or more. Alternatively, the output nf2 indicates the value "0" when the number of "1"s included in the inputs pf1 and pf2, and the defective bit data fb[0] to fb[b-1] is zero or one. The output r indicates the value "1" when the number of "1"s included in the inputs pf1 and pf2, and the defective bit data fb[0] to fb[b-1] is three or more. Alternatively, the output r indicates the value "0" when the number of "1"s included in the inputs pf1 and pf2, and the defective bit data fb[0] to fb[b-1] is two or less. The output r indicates "1" when it is determined that the memory 16 may not be repaired. Since the fuse group 18-1 undergoes the cutoff operation earlier than the fuse group 18-2, the input pf2 indicates "1" when the input pf1 indicates "1".

The information fb1 is hereinafter referred to also as "output fb1". The output fb1 obtains a bit pattern ("All 0") in which the values are all "0" when the input pf1 indicates "0" and the bit values of the defect information fb are all "0". When the input pf1 indicates "1", the output fb1 obtains a bit pattern ("All 1") in which the values are all "1". Alternatively, when the input pf1 indicates "0", the output fb1 obtains a bit pattern in which "0" is successively indicated in the bit location(s) before the bit location in which the value "1" is obtained for the first time when determining the bit values of the information fb in the order from the 0th bit location, and "1" is successively indicated in the bit locations from the bit location, in which the value "1" is obtained for the first time when determining the bit values of the information fb in the order from the 0th bit location, to the b-1th bit location (see *1 in FIG. 8A). FIG. 8B is a chart of examples of the bit pattern in which "0" is successively indicated in the bit location(s) before the bit location in which the value "1" is obtained for the first time when determining the bit values of the information fb in the order from the 0th bit location, and "1" is successively indicated in the bit locations from the bit location, in which the value "1" is obtained for the first time when determining the bit values of the information fb in the order from the 0th bit location, to the b-1th bit location. The leftmost column of FIG. 8B indicates 6-bit patterns of the data fb[0] to fb[5], that is, bits fb[5:0]. The middle column of FIG. 8B marked with *1 indicates bit patterns in each of which, when a Zth bit location is the bit location in which the value "1" is obtained for the first time when determining the bits [5:0] in the order from the 0th bit location, "0" is successively indicated in the bit location(s) before the Zth bit location and "1" is successively indicated in the bit locations from the Zth bit location to the b-1th bit location.

The information fb2 is hereinafter referred to also as "output fb2". The output fb2 obtains a bit pattern ("All 0") in which the values are all "0" when the inputs pf1 and pf2 indicate "0" and the number of "1"s included in the defect information fb is one or less. When the inputs pf1 and pf2 indicate "0" and the number of "1"s included in the defect information fb is two or more, the output fb2 obtains a bit pattern in which "0" is successively indicated in the bit locations before the bit location in which the value "1" is obtained for the second time when determining the bit values of the information fb in the order from the 0th bit location, and "1" is successively indicated in the bit locations from the bit location, in which the value "1" is obtained for the second time when determining the bit values of the information fb in the order from the 0th bit location, to the b-1th bit location (see *2 in FIG. 8A). FIG. 8B is a chart of examples of the bit pattern in which "0" is successively indicated in the bit locations before the bit location in which the value "1" is obtained for the second time when determining the bit values of the information fb in the order from the 0th bit location, and "1" is successively indicated in the bit locations from the bit location, in which the value "1" is obtained for the second time when determining the bit values of the information fb in the order from the 0th bit location, to the b-1th bit location. The rightmost column of FIG. 8B marked with *2 indicates bit patterns in each of which, when a Zth bit location is the bit location in which the value "1" is obtained for the second time when determining the bits [5:0] in the order from the 0th bit location, "0" is successively indicated in the bit locations before the Zth bit location, and "1" is successively indicated in the bit locations from the Zth bit location to the b-1th bit location.

The output fb2 obtains a bit pattern ("All 0") in which the values of the defect information fb are all "0" when the input pf1 indicates "1" and the input pf2 indicates "0", and the number of "1"s included in the defect information fb is zero. When the input pf1 indicates "1" and the input pf2 indicates "0", and the number of "1"s included in the defect information fb is one or more, the output fb2 obtains the bit pattern in which "0" is successively indicated in the bit location(s) before the bit location in which the value "1" is obtained for the first time when determining the bit values of the information fb in the order from the 0th bit location, and "1" is successively indicated in the bit locations from the bit location, in which the value "1" is obtained for the first time when determining the bit values of the information fb in the order from the 0th bit location, to the b-1th bit location. That is, the aforementioned bit pattern represented by *1 may be obtained. Since the input pf1 already indicates "1", the bit value of the defect information fb becomes "1" for the first time in the bit location in which the value "1" is obtained for the second time. When the input pf1 indicates "1" and the input pf2 indicates "1", the output fb2 obtains a bit pattern ("All 1") in which the values are all "1".

The information fb1 obtained as described above is supplied to the encoder 51-1 in FIG. 6. Similarly, the information fb2 obtained as described above is supplied to the encoder 51-2 in FIG. 6. In the initial state, the information fb1 indicates a defective portion corresponding to the bit location in which the bit value becomes "1" first when the bit values of the information fb are determined in the order from the 0th bit location. The information fb2 indicates a defective portion corresponding to the bit location in which the bit value becomes "1" for the second time when the bit values of the defect information fb are determined in the order from the 0th bit location. In a state other than the initial state, that is, when the input pf1 does not indicate "0", the information fb2 indicates the defective portion corresponding to the bit location in which the bit value becomes "1" first when the bit values of the defect information fb are determined in the order from the 0th bit location. The information fb1 is used for setting the fuse group 18-1, and the information fb2 is used for setting the fuse group 18-2.

FIG. 9 illustrates relationships between the locations of defective bits and fuse cutoff patterns. In FIG. 9, the defect information fb has six bits and three fuses are used. The number f of the fuse circuits 40-1 to 40-f in FIG. 5 is three. As illustrated in FIG. 9, when the 0th bit is defective, that is, when the data fb[0] indicates "1", the 0th fuse of the three fuses in the fuse group is cut off. That is, the fuse 42 of the fuse circuit 40-1 in FIG. 5 is cut off so that the information fgx[0] of the fuse group 18-x (x=1 or 2) may indicate "1". When the fourth bit is defective for example, that is, when the data fb[4] indicates "1", the 0th and second fuses of the three fuses in the fuse group are cut off. The fuses 42 of the fuse circuits 40-1 and 40-3 are cut off so that the information fgx[0] and fgx[2] of the fuse group 18-x (x=1 or 2) may indicate "1". Thus, the defective bit location in which one of the six bits has the value "1" is indicated in binary with three bits. The fuse corresponding to the bit location of the three bits in which the value "1" is indicated is cut off.

FIG. 10 illustrates relationships between inputs and outputs of the encoder 51-1 or 51-2 in FIG. 6. The inputs of the encoder 51-1 are the information fb1 regarding 6-bit defective portions, and the inputs of the encoder 51-2 are the information fb2 regarding 6-bit defective portions. The left column of FIG. 10 indicates the defect information fb1 or fb2 as the inputs. The right column of FIG. 10 indicates three bits that the encoder 51-1 or 51-2 outputs. As indicated in FIG. 10, the encoder 51-1 or 51-2 indicates the bit location, in binary, in which "1" is obtained for the first time when the input six bits are determined sequentially from the least significant bit, and outputs the 3-bit data indicated in binary. As illustrated in FIG. 6, the encoder 51-1 outputs the 3-bit code tcs1 to the enable circuit 52-1. Alternatively, as also illustrated in FIG. 6, the encoder 51-2 outputs the 3-bit code tcs2 to the enable circuit 52-2.

Figure 11:
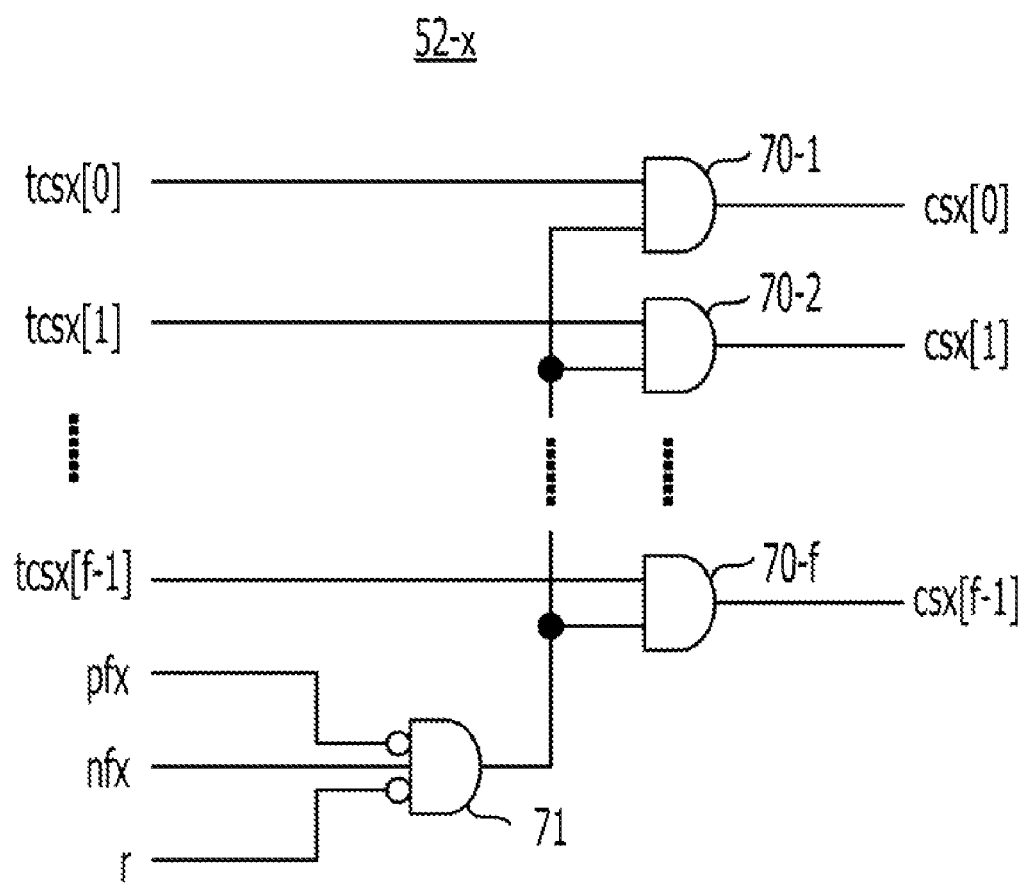
FIG. 11 illustrates an enable circuit.

FIG. 11 illustrates the enable circuit 52-1 or 52-2. The enable circuit 52-x (x=1 or 2) includes AND circuits 70-1 to 70-f, and an AND circuit 71. When certain conditions are met, the enable circuit 52-x supplies outputs tcsx[0] to tcsx[f-1] from the encoder 51-x to the fuse group 18-x as the signals csx[0] to csx[f-1] without changing the outputs tcsx[0] to tcsx[f-1]. When the certain conditions are not met, the enable circuit 52-x outputs the signals csx[0] to csx[f-1] all of which indicate "0" so that the fuses of the fuse group 18-x in FIG. 5 are not cut off.

The certain conditions described above include that a signal pfx is "0", a signal nfx indicates "1", and the determination signal r indicates "0". When the signal pfx indicates "0", the corresponding fuse group 18-x does not undergo the writing operation, that is, the fuse is not cut off (the stored information is not modified). When the signal nfx indicates "1", the corresponding fuse group 18-x is desired to undergo the writing operation, that is, the fuse is desired to be cut off (the stored information is desired to be modified). When the determination signal r indicates "0", the memory 16 may be repaired, that is, the number of defective portions is f or less (in FIG. 11, two or less), and the fuse groups 18-1 and 18-2 may be used to repair the f or less defective portions. When the memory 16 may not be repaired, the determination signal r indicates "1" and the signals csx[0] to csx[f-1] indicating "0" are output. Accordingly, the fuse of the fuse group 18-x in FIG. 5 is not cut off. As described above, test time and power consumption may be reduced by reducing if not preventing undesirable cutoff operations of the fuses.

Figure 12:
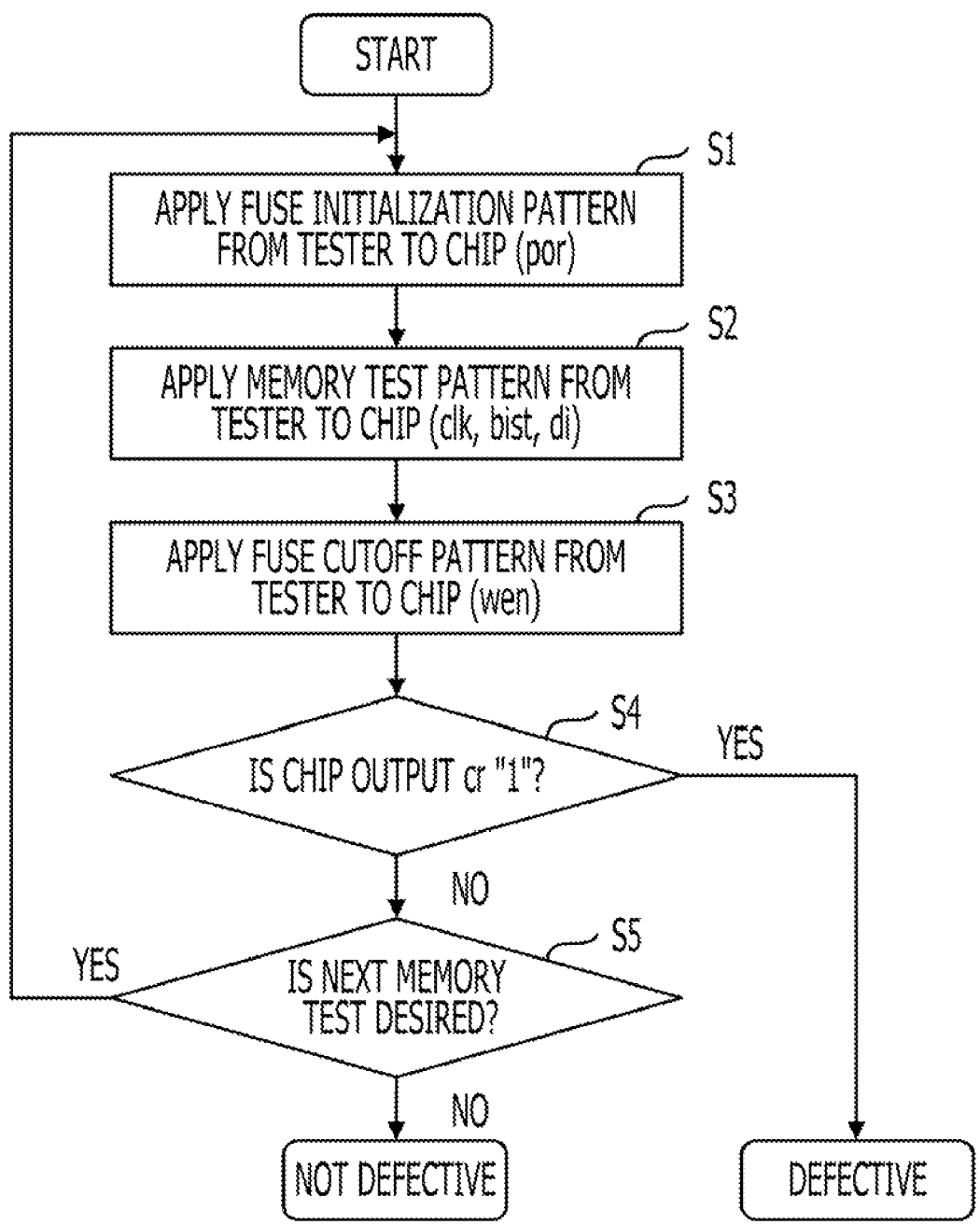
FIG. 12 illustrates operations of the semiconductor device test system in FIG. 1.

FIG. 12 illustrates the operations of the semiconductor device test system in FIG. 1. In Operation S1, the tester 10 applies a fuse initialization pattern to the semiconductor device 11. The tester 10 asserts the fuse group output initialization signal por and sets each of the information fg1 and fg2 output from the fuse groups 18-1 and 18-2 in a state corresponding to the internal fuse.

In Operation S2, the tester 10 applies a memory test pattern to the semiconductor device 11. That is, the tester 10 supplies the clock signal clk, the BIST start signal bist, and the initial data di to the MBIST circuit 15. In response to the BIST start signal bist, the MBIST circuit 15 starts a test operation synchronized with the clock signal clk, generates various addresses and data based on the initial data di, applies the generated addresses and data to the memory 16, and tests the memory 16. Thus, the MBIST circuit 15 outputs the defect information fb, and the information cs1 and cs2 generated by the control circuit 17 is supplied to the fuse groups 18-1 and 18-2, respectively.

In Operation S3, the tester 10 applies a fuse cutoff pattern to the semiconductor device 11. That is, the fuse cutoff operation is performed based on the information cs1 and cs2 when the tester 10 applies the fuse cutoff instruction signal wen to the fuse groups 18-1 and 18-2.

In Operation S4, the tester 10 determines whether or not a chip output cr indicates "1". The chip output cr is an output of the OR circuit 13 in FIG. 1. The OR circuit 13 receives the determination signals r from the memory units 12-1 to 12-n as inputs, and generates the chip output cr by performing an OR operation on the inputs. The chip output cr is a signal that is asserted when at least one of the memories 16 of the memory units 12-1 to 12-n is not repairable. When it is determined in Operation S4 that the chip output cr indicates "1", the operations end and it is determined that the chip is defective. When it is determined in Operation S4 that the chip output cr indicates "0", the flow proceeds to Operation S5.

In Operation S5, the tester 10 determines whether or not a next memory test is desired. For example, since some memory cells are determined as defective in a test performed under certain voltage and temperature conditions, the memory test is desirably performed two or more times under different voltage and temperature conditions. When the memory test is performed two or more times, the determination result of Operation S5 is "Yes" and the flow returns to Operation S1, and the operations thereafter are repeated. A defective portion discovered after each operation of the memory test is repaired in Operation S3. Each time a defective portion is discovered in a new memory test performed on the memory units 12-1 to 12-n, a fuse group other than the fuse group that has already undergone the cutoff operation may be selected as a next cutoff target. When it is determined in Operation S5 that a next memory test is undesired, the operations end and the chip is determined as not defective.

Figure 13:
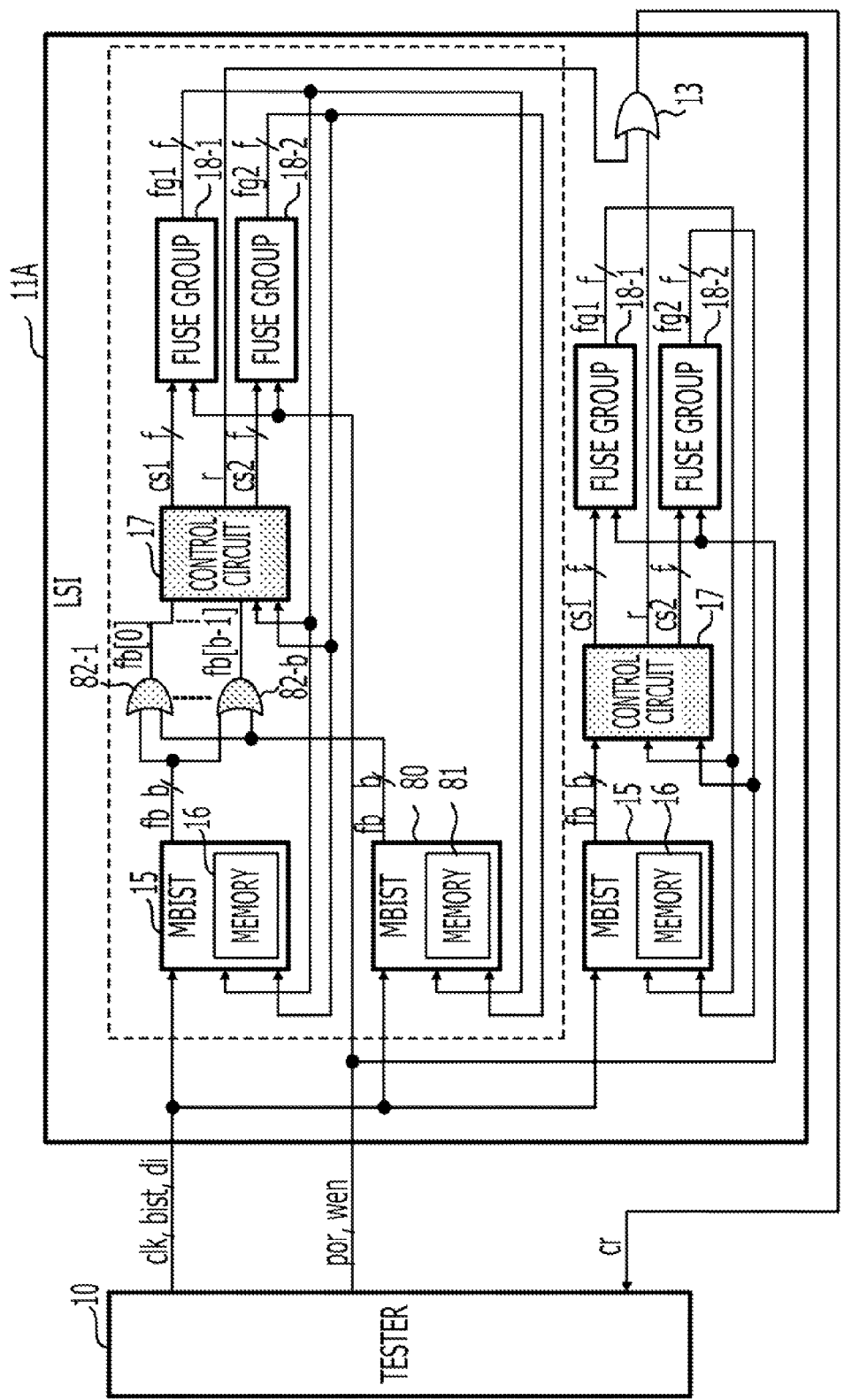
FIG. 13 illustrates another semiconductor device test system.

FIG. 13 illustrates another semiconductor device test system (a semiconductor device 11A). Elements in FIG. 13 similar to the elements in FIG. 1 are denoted with the same reference numerals and descriptions thereof are omitted. The semiconductor device 11A includes an MBIST circuit 80, a memory 81, and OR circuits 82-1 to 82-b in addition to the elements of the semiconductor device 11 in FIG. 1. A control circuit 17 in FIG. 13 determines modified information cs1 and cs2 to be stored in fuse groups 18-1 and 18-2 based on unmodified information fg1 and fg2 stored in the fuse groups 18-1 and 18-2, defect information output from an MBIST circuit 15, and defect information output from the MBIST circuit 80. The OR circuits 82-1 to 82-b perform OR operations on each bit of the defect information output from the MBIST circuits 15 and 80. The control circuit 17 determines the modified information cs1 and cs2 based on the information obtained by performing the OR operations on bits of both of the defect information, and based on the unmodified information fg1 and fg2.

When a defective portion is found in data bit1 of the MBIST circuit 15 and a defective portion is found in data bit5 of the MBIST circuit 80, the fuse group 18-1 stores information that indicates the location of the defective data bit1 and the fuse group 18-2 stores information that indicates the location of the defective data bit5. The memories 16 and 81 perform the redundant operations based on the information stored in the fuse groups 18-1 and 18-2. Thus, the data bit1 and bit5 are replaced with redundant memory cells in the memory 16 and the data bit1 and bit5 are replaced with redundant memory cells also in the memory 81. The replacement of the data bit5 is undesired in the memory 16, and the replacement of the data bit1 is undesired in the memory 81. However, such undesired replacements may cause no disadvantages.

When the defective bit location in the memory 16 and the defective bit location in the memory 81 completely match each other, two defective portions may be repaired in each of the memories 16 and 18, that is, a total of four defective portions may be repaired. When the defective bit location in the memory 16 and the defective bit location in the memory 81 do not match each other at all, one defective portion may be repaired in each of the memories 16 and 18, that is, a total of two defective portions may be repaired. According to the configuration in FIG. 13, the redundant operation may be performed efficiently while reducing the numbers of the control circuits 17, and the fuse groups 18-1 and 18-2 for the memories.

All examples and conditional language recited herein are intended for pedagogical purposes to aid the reader in understanding the aspects of the invention and the concepts contributed by the inventor to furthering the art, and are to be construed as being without limitation to such specifically recited examples and conditions, nor does the organization of such examples in the specification relate to a showing of the superiority and inferiority of the aspects of the invention. Although the embodiment in accordance with aspects of the present invention has been described in detail, it should be understood that various changes, substitutions, and alterations could be made hereto without departing from the spirit and scope of the invention.

Moreover, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A semiconductor device comprising:
   a first memory including first memory blocks and first redundant memory blocks;

a first test circuit configured to test the first memory and output first defect information indicating a defective portion of the first memory blocks;

a first storage part including information for replacing one of the first memory blocks with one of the first redundant memory blocks; and a first control circuit configured to modify the information based on the information stored in the first storage part and the first defect information, and store the modified information in the first storage part, wherein the first memory identifies the defective portion based on the modified information of the first storage part and replaces one of the first memory blocks with one of the first redundant memory blocks, and the first defect information indicates a plurality of defective portions, and the first control circuit generates information indicating each of the defective portions based on the first defect information indicating the defective portions.

2. The semiconductor device according to claim 1, wherein the first control circuit is a combinational logic circuit.

3. The semiconductor device according to claim 1, wherein the first control circuit outputs a determination signal indicating whether or not the first memory is repairable based on the unmodified information stored in the first storage part and the first defect information.

4. The semiconductor device according to claim 1, wherein the first defect information output from the first test circuit is data in which the number of bits is equal to the number of bits of data output from the first memory, and the first control circuit generates the modified information to be stored by converting the first defect information into a code with bits fewer than the bits of the data output from the first memory.

5. The semiconductor device according to claim 1, wherein the first storage part is made up of a plurality of circuits configured to store information by an electric fuse, and when the first memory is determined to not be repairable based on the unmodified information stored in the first storage part, and the first defect information, the first control circuit controls the first storage part so that the electric fuse is not cut off.

6. The semiconductor device according to claim 1, further comprising:

a second memory including second memory blocks and second redundant memory blocks;

a second test circuit configured to test the second memory and output second defect information indicating a defective portion of the second memory blocks;

a second storage part including information for replacing one of the second memory blocks with one of the second redundant memory blocks;

a second control circuit configured to also modify information based on the information stored in the second storage part and the second defect information, and store the also-modified information in the second storage part; and an OR circuit, wherein the first control circuit outputs a first determination signal indicating whether or not the first memory is repairable to the OR circuit, and the second control circuit outputs a second determination signal indicating whether or not the second memory is repairable to the OR circuit, and the OR circuit outputs a signal asserted when at least one of the first memory and the second memory is not repairable.

7. The semiconductor device according to claim 1, further comprising:

a second memory including second memory blocks and second redundant memory blocks; and a second test circuit configured to test the second memory and output second defect information indicating a defective portion of the second memory blocks, wherein the first control circuit configured to modify the information based on the information stored in the first storage part, the first defect information, and also the second defect information, and store the modified information in the first storage part, and the first memory replaces one of the first memory blocks including a portion identified based on the modified information of the first storage part with one of the first redundant memory blocks, and the second memory replaces one of the second memory blocks including a portion identified based on the modified information of the first storage part with one of the second redundant memory blocks.

8. The semiconductor device according to claim 7, wherein the first control circuit determines the modified information to be stored in the first storage part based on information obtained by performing an OR operation on bits of the first defect information and the second defect information, and the unmodified information stored in the first storage part.

9. A semiconductor device test method comprising:

testing a memory that is included in a semiconductor device and includes memory blocks and redundant memory blocks;

generating defect information indicating a defective portion included in the memory blocks;

modifying information stored in a storage part included in the semiconductor device based on the defect information by performing a logic operation in the semiconductor device; and writing the modified information in the storage part to replace one of the memory blocks including the defective portion identified based on the modified information of the storage part with one of the redundant memory blocks, wherein the defect information indicates a plurality of defective portions, and generating information indicating each of the defective portions based on the defect information indicating the defective portions.

10. The semiconductor device test method according to claim 9, wherein the memory includes a first memory and a second memory, and the modified information is determined based on the unmodified information stored in the storage part, first defect information generated by testing the first memory, and second defect information generated by testing the second memory.

11. The semiconductor device test method according to claim 10, wherein the first memory includes first memory blocks and first redundant memory blocks, the second memory includes second memory blocks and second redundant memory blocks, wherein when the modified information is written in the storage part, one of the first memory blocks including a portion identified based on the modified information is replaced with one of the first redundant memory blocks, and one of the second memory blocks including a portion identified based on the modified information is replaced with one of the second redundant memory blocks.

12. The semiconductor device test method according to claim 9, wherein the modified information is determined by converting the defect information into a code with bits fewer than bits of data output from the memory.

* * * * *